United States Patent
Cai et al.

(10) Patent No.: US 8,525,514 B2
(45) Date of Patent: Sep. 3, 2013

(54) MAGNETOMETER

(75) Inventors: Yongyao Cai, Acton, MA (US); Jerome S. Marcelino, Mountain View, CA (US); Yang Zhao, Andover, MA (US); Mark Laich, Boston, MA (US); Haidong Liu, Jiangsu (CN); Zongya Li, Jiangsu (CN)

(73) Assignee: Memsic, Inc., Andover, MA (US)

( * ) Notice: Subject to any disclaimer, the term of this patent is extended or adjusted under 35 U.S.C. 154(b) by 692 days.

(21) Appl. No.: 12/727,616

(22) Filed: Mar. 19, 2010

(65) Prior Publication Data

US 2011/0227569 A1 Sep. 22, 2011

(51) Int. Cl.
*G01R 33/02* (2006.01)
(52) U.S. Cl.
USPC .......................................................... 324/252
(58) Field of Classification Search
None
See application file for complete search history.

(56) References Cited

U.S. PATENT DOCUMENTS

| | | |
|---|---|---|
| 4,296,377 A | 10/1981 | Ohkubo |
| 4,525,671 A | 6/1985 | Sansom |
| 4,533,872 A | 8/1985 | Boord et al. |
| 4,847,584 A | 7/1989 | Pant |
| 4,918,824 A | 4/1990 | Farrar |
| 4,922,606 A | 5/1990 | Alexander et al. |
| 5,027,243 A | 6/1991 | Gill et al. |
| 5,046,260 A | 9/1991 | Wellhausen |
| 5,055,786 A | 10/1991 | Wakatsuki et al. |
| 5,161,311 A | 11/1992 | Esmer et al. |
| 5,247,278 A | 9/1993 | Pant et al. |
| 5,255,442 A | 10/1993 | Schierbeek et al. |
| 5,521,501 A | 5/1996 | Dettmann et al. |
| 5,583,436 A | 12/1996 | Van De Walle et al. |
| 5,850,624 A | 12/1998 | Gard et al. |
| 5,890,099 A | 3/1999 | Abendroth |
| 5,952,825 A | 9/1999 | Wan |
| 6,100,686 A | 8/2000 | Van Delden et al. |
| 6,166,539 A | 12/2000 | Dahlberg et al. |
| 6,529,114 B1 | 3/2003 | Bohlinger et al. |
| 6,651,003 B2 | 11/2003 | Woloszyk et al. |
| 6,700,761 B2 * | 3/2004 | Ihara et al. ................. 360/327 |
| 7,126,327 B1 | 10/2006 | Busch |

(Continued)

FOREIGN PATENT DOCUMENTS

| | | |
|---|---|---|
| DE | 3442278 | 5/1986 |
| EP | 0 544 479 | 6/1993 |
| EP | 0 676 901 | 10/1995 |

OTHER PUBLICATIONS

Philips Semiconductors, "A World of Sensing Possiblities", © Philips Electronics N.V. 2001.
Perry A. Holman, Ph.D., Magnetoresistance (MR) Transducers and How to Use Them as Sensors, 1st Edition, Jul. 2004, 66 pgs.
Bartos, Axel and Meisenberg, Armin; "An Introduction to Magnetoresistive Sensors"; MR Basics—MEAS Deutschland GMBH—Measurement Specialties; (2008).
Tsang C. and Fontana, R.E., JR.; "Fabrication and Wafer Testing of Barber-Pole and Exchange-Biased Narrow-Track MR Sensors"; IEEE Transactions on Magnetics; (1982); 18(6): 1149-1151.

*Primary Examiner* — Jermele M Hollington
(74) *Attorney, Agent, or Firm* — Preti Flaherty Beliveau & Pachios LLP

(57) ABSTRACT

A magnetometer with only a SET operation for initiating a magnetic orientation within a magnetic field sensor based on anisotropic magnetoresistive (AMR) technology. Within the magnetometer, the relative orientations of the respective X, Y and Z axes detectors are maintained by a package in which all detectors are mounted on a single assembly with the Z axis sensor displaced and held orthogonal to the other two sensors by potting material. Shorting bars on respective barber pole structures are provided with a geometry that allows for closer placement of adjacent barber poles to one another. The barber pole structures are deposited in a nested orientation which provides for balanced resistance legs in a Wheatstone bridge construction.

7 Claims, 10 Drawing Sheets

(56) References Cited

U.S. PATENT DOCUMENTS

| | | |
|---|---|---|
| 7,331,115 B2 | 2/2008 | Schierbeek et al. |
| 7,504,824 B2 | 3/2009 | Crolly et al. |
| 7,536,909 B2 | 5/2009 | Zhao et al. |
| 8,164,332 B2 * | 4/2012 | Bartos et al. .................. 324/252 |
| 2003/0132826 A1 | 7/2003 | Wan |
| 2005/0140363 A1 * | 6/2005 | Grimm et al. ............ 324/207.21 |
| 2005/0154549 A1 | 7/2005 | Lin et al. |
| 2007/0080683 A1 * | 4/2007 | Bartos et al. .................. 324/252 |
| 2009/0059444 A1 | 3/2009 | Mather et al. |
| 2009/0219011 A1 | 9/2009 | James |
| 2009/0315129 A1 | 12/2009 | Albertini |
| 2012/0194180 A1 * | 8/2012 | Raberg .......................... 324/252 |
| 2013/0015845 A1 * | 1/2013 | Fox ........................... 324/207.21 |

* cited by examiner

MAGNETOMETER

STATEMENT REGARDING FEDERALLY SPONSORED RESEARCH OR DEVELOPMENT

N/A

BACKGROUND OF THE INVENTION

Recently, the demand for magnetic field sensors for electronic compass applications has been increasing rapidly as GPS functionality in hand-held devices, for example, cellular phones, personal navigation devices, etc., includes such functions. Recent studies have shown that, even with the current slowing global economy, GPS-enabled handsets sales are expected to reach over 240 million units in 2009. This will be an increase of over 6% from 2008 while the overall cellular phone market is expected to shrink by 4% to 8%. Magnetic sensors enhance GPS mobile phones in many aspects, including dead reckoning, map orientation, initial heading indication, and especially, location-based services.

Magnetic field sensors based on anisotropic magnetoresistive (AMR) technology are well known. Examples of such technology are described in U.S. Pat. Nos. 4,847,584; 5,247,278; 5,521,501 and 5,952,825, each of which is herein incorporated by reference for all purposes.

What is needed however, is an accurate magnetic field sensor that is small in size, low cost, that requires low power as is necessitated by mobile device applications, is easy to use and that is easily incorporated into a mobile device.

BRIEF SUMMARY OF THE INVENTION

Embodiments of the present invention are directed to a tri-axis magnetometer based on anisotropic magnetoresistive (AMR) technology. Further, three separate single axis AMR sensors are provided to form part of a complete magnetic field measurement system.

In one embodiment of the present invention, a RESET function is eliminated and a SET function frequency is reduced by orders of magnitude as compared to known systems. Rather than applying SET and RESET currents for every measurement, only a SET current is passed through a SET coil in order to orient a respective magnetic axis of the barber pole structures. This action aligns the magnetic domain orientations of these barber pole structures into one consistent direction. Thus, for a considerably longer period of time, as compared to known systems, no current need pass through the SET coil, thus conserving power.

In another embodiment of the present invention, an automatic calibration system monitors the sensor output as it changes in response to a change in position of the device relevant to the earth's magnetic field. As the sensor rotates through different positions and orientations, it will experience maximum and minimum readings of the earth's local magnetic field. A difference between these two readings, i.e., the maximum and minimum, will represent twice the magnitude of the earth's magnetic field and the average will be the sensor offset. If the sensor offset value is larger than some predetermined threshold value then a SET pulse is sent through the SET coil.

In one embodiment of the present invention, a compact and well balanced sensor is provided as a result of the layout of the barber pole structures. The barber pole structures in a first leg portion of a Wheatstone bridge circuit are all of a negative polarity and in series with one another while undulating across a SET coil portion. The barber pole structures with positive polarity are also in series with one another while undulating across the SET coil. Further, the barber pole structures located in a second leg portion of the Wheatstone bridge are positioned with respect to a second coil portion of the SET coil.

In one embodiment of the present invention, a "nesting" of the conductors connecting the barber pole structures in a magnetometer provides for a resistive balance within a Wheatstone bridge circuit such that the two legs are evenly matched with each other. Further, additional lead length is provided in the conductors in order to adjust and balance the total resistance seen in both legs of the Wheatstone bridge.

In another embodiment of the present invention, the integrated tri-axis magnetometer is provided in a package that maintains accurate orthogonal angles between the X, Y and Z axes of the three sensors. The three sensors and an ASIC are flip-chip bonded on a flexible substrate. Once the ASIC and the sensors are bonded to the substrate, a tab portion is defined by excising or cutting along a line or boundary adjacent to the Z-axis sensor. Once the line or boundary is cut, such that that the tab portion of the flexible substrate is hingeably separated from the remaining material, the flexible substrate is placed in a carrier. The carrier, with the flexible substrate loaded therein, is located above a positioning fixture having an orienting punch located below the Z-axis sensor. A portion of the flexible circuit is displaced so as to be oriented substantially at 90° with respect to the surface of the flexible substrate and, therefore, also with respect to the other sensors. The package is then sealed with potting material to maintain the orthogonal relationship.

In yet another embodiment of the present invention, the shorting strips or bars that make up the barber pole structures are designed to allow their placement as close to one another as possible without risking a short circuit that would affect proper operation. A corner of each shorting bar is cut at an angle to present an offset portion on each shorting bar in order to maximize the distance between adjacent shorting bars. Advantageously, by clipping the corners of the shorting bars, an additional space between adjacent shorting bars is provided and, therefore, the barber pole structures can be placed closer to one another.

BRIEF DESCRIPTION OF THE SEVERAL VIEWS OF THE DRAWINGS

Embodiments of the present invention may be better understood by referring to the following description in conjunction with the accompanying drawings in which.

Figure 1:
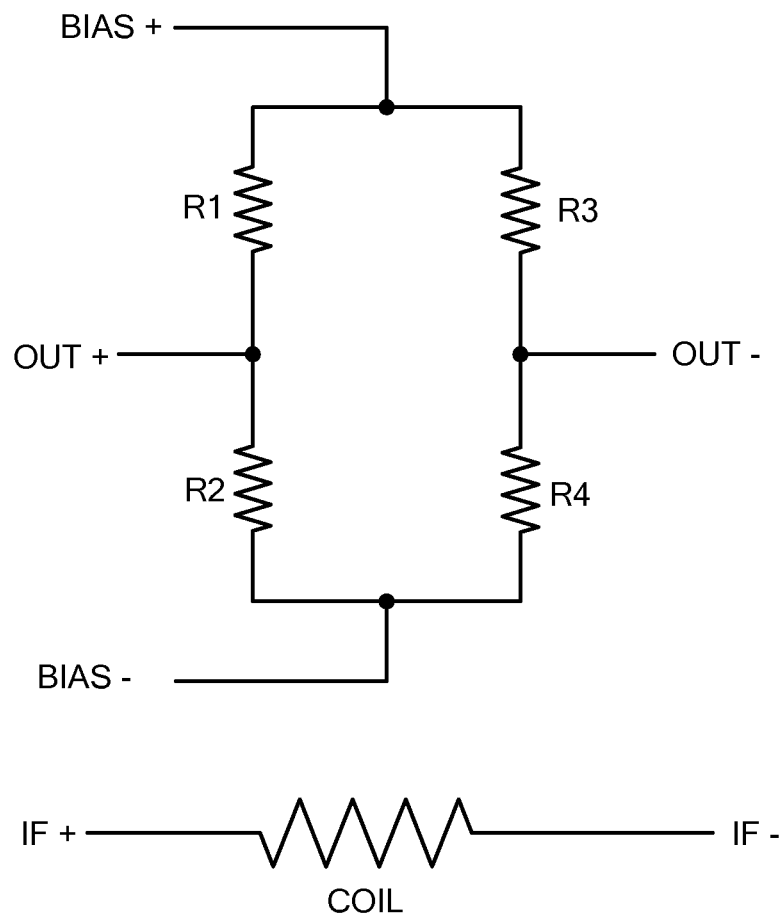
FIG. 1 is an electrical circuit diagram of one embodiment of the present invention.

It will be appreciated that for simplicity and clarity of illustration, elements shown in the drawings have not necessarily been drawn accurately or to scale. For example, the dimensions of some of the elements may be exaggerated relative to other elements for clarity or several physical components may be included in one functional block or element. Further, where considered appropriate, reference numerals may be repeated among the drawings to indicate corresponding or analogous elements. Moreover, some of the blocks depicted in the drawings may be combined into a single function.

DETAILED DESCRIPTION OF THE INVENTION

In the following detailed description, numerous specific details are set forth in order to provide a thorough understanding of the embodiments of the present invention. It will be understood by those of ordinary skill in the art that these embodiments of the present invention may be practiced without some of these specific details. In other instances, well-known methods, procedures, components and structures may not have been described in detail so as not to obscure the embodiments of the present invention.

Embodiments of the present invention include a magnetic field sensor based on anisotropic magnetoresistive (AMR) technology. A thin film permalloy material is deposited on a silicon wafer while a strong magnetic field is applied to create permalloy resistors. The magnetic domains of these permalloy resistors are aligned in the same direction as the applied field thereby establishing a magnetization vector. Subsequent lithographic and etching steps define the geometry of the AMR resistors.

Before explaining at least one embodiment of the present invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein are for the purpose of description and should not be regarded as limiting.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination.

In operation, electric current flows through the AMR resistor, and an external magnetic field, for example, earth's local magnetic field, modifies the magnetization vector and changes the resistance of the AMR. This is known and understood by those of ordinary skill in the art.

Referring now to FIG. 1, four such AMR resistors R1-R4 are constructed into a Wheatstone bridge configuration. The circuit shown in FIG. 1 represents one sensor and is meant to detect magnetization in one magnetic field axis when appropriately oriented. In order to detect the magnetic field in each of the X, Y and Z axes, three such circuits would be provided, and oriented, with respect to each other in order to make such measurements.

As will be described in more detail below, embodiments of the present invention provide for good matching among the four AMR resistors in each bridge circuit and, therefore, in the absence of an external magnetic field, the bridge is balanced and produces a near zero voltage difference between the two output nodes OUT+ and OUT−. In the presence of an external magnetic field, the resistance of the AMR resistors changes in accordance with the magnetic field magnitude and polarity so that a differential voltage signal appears on the two output nodes OUT+ and OUT−.

In one embodiment of the present invention, each of the AMR resistors R1-R4 is constructed with shorting bars added following the permalloy fabrication steps. As known, these shorting bars are common in AMR sensors and resistors in order to form what are referred to as "barber pole" structures that linearize the sensor output with respect to an external field. A SET coil is provided to set an initial magnetization vector direction as part of the calibration system as will be described in more detail below.

Figure 2:
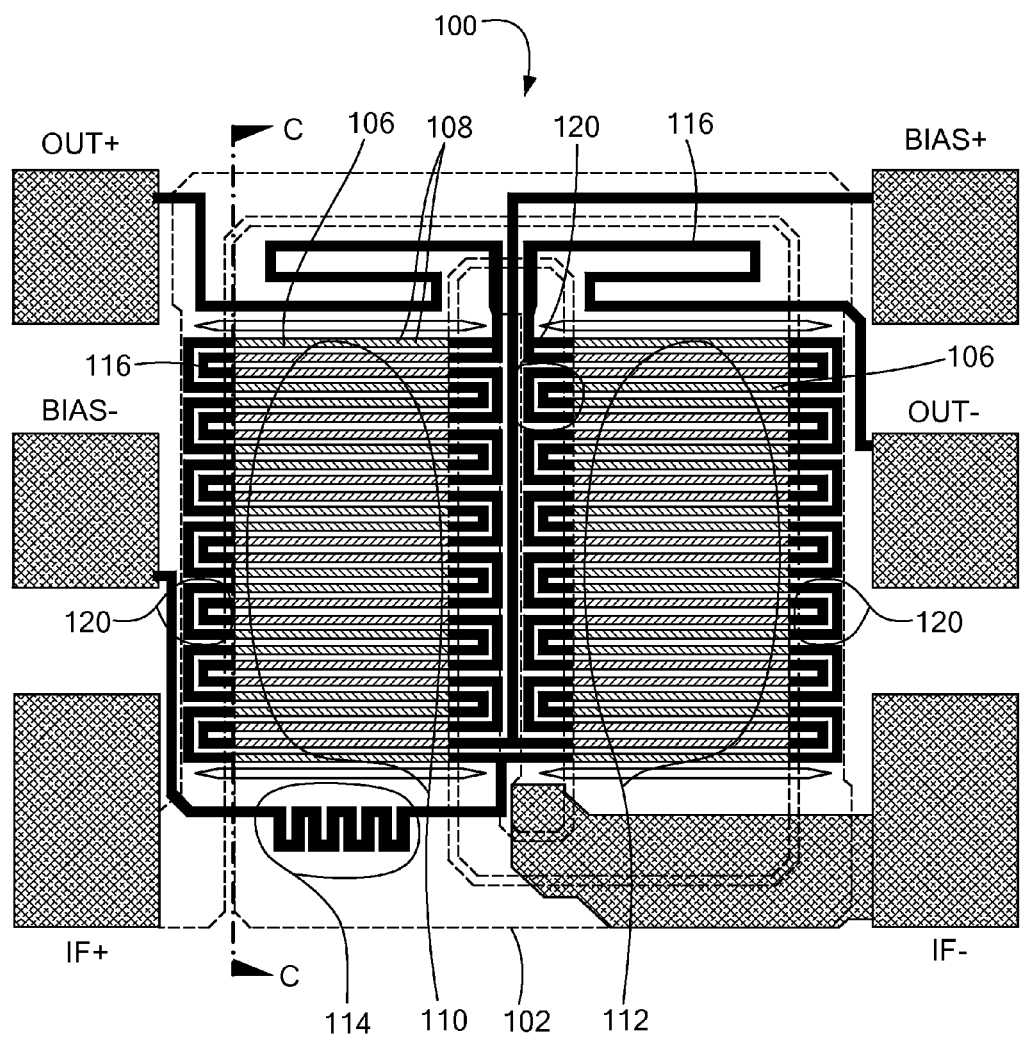
FIG. 2 is a layout diagram of a magnetic field sensor in accordance with one embodiment of the present invention.
Figure 3:
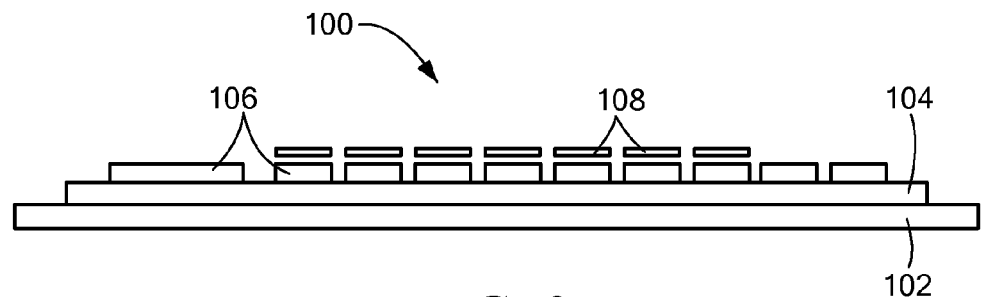
FIG. 3 is a cross-sectional view of the magnetic field sensor of FIG. 2 taken along line C-C.

Referring to FIG. 2, a magnetic sensor 100 is shown from a top perspective looking down on (and through) the thin film permalloy material as deposited on a silicon wafer. The representation shown in FIG. 2 is a "stack-up" of a plurality of layers which can be seen in FIG. 3 which is a cross-section of the component 100 taken along the line C-C.

Referring to FIG. 2, a first layer 102 is a SET coil oriented as a planar structure that spirals inwardly on itself. As shown in FIG. 2, the SET coil 102 is "below" a silicon layer 104, shown in FIG. 3, on which a plurality of permalloy leads 106 have been deposited. The orientation and structure of these permalloy leads 106 will be discussed in further detail below but it should be noted that "below" is only a relative position and not intended to be limiting.

As known to one of ordinary skill in the art, shorting bars 108 are provided on portions of the permalloy leads 106 to create barber pole structures.

As a convention in this specification, but one that is not intended to limit any embodiments of the present invention unless otherwise noted, those shorting bars 108 that are oriented as "back-slashes," i.e., upward to the left, as shown in FIG. 2 as \\\\ will be referred to as negatively polarized whereas shorting bars that are oriented as "forward-slashes," i.e., upward to the right, and shown as //// in FIG. 2, will be referred to as having a positive polarity.

The shorting bars 108 positioned over portions of the permalloy leads 106 create barber pole structures which are arranged in series and in a Wheatstone bridge configuration to obtain the functional circuit as shown in FIG. 1.

Contact pads are provided to connect to the OUT+ and OUT− nodes, the BIAS+ and BIAS-nodes and to the IF+ and IF− nodes of the SET coil 102. The mechanics and modes of connecting these output pads to the portions of the sensor 100 are known to those of ordinary skill in the art and need not be discussed here.

Figure 4:
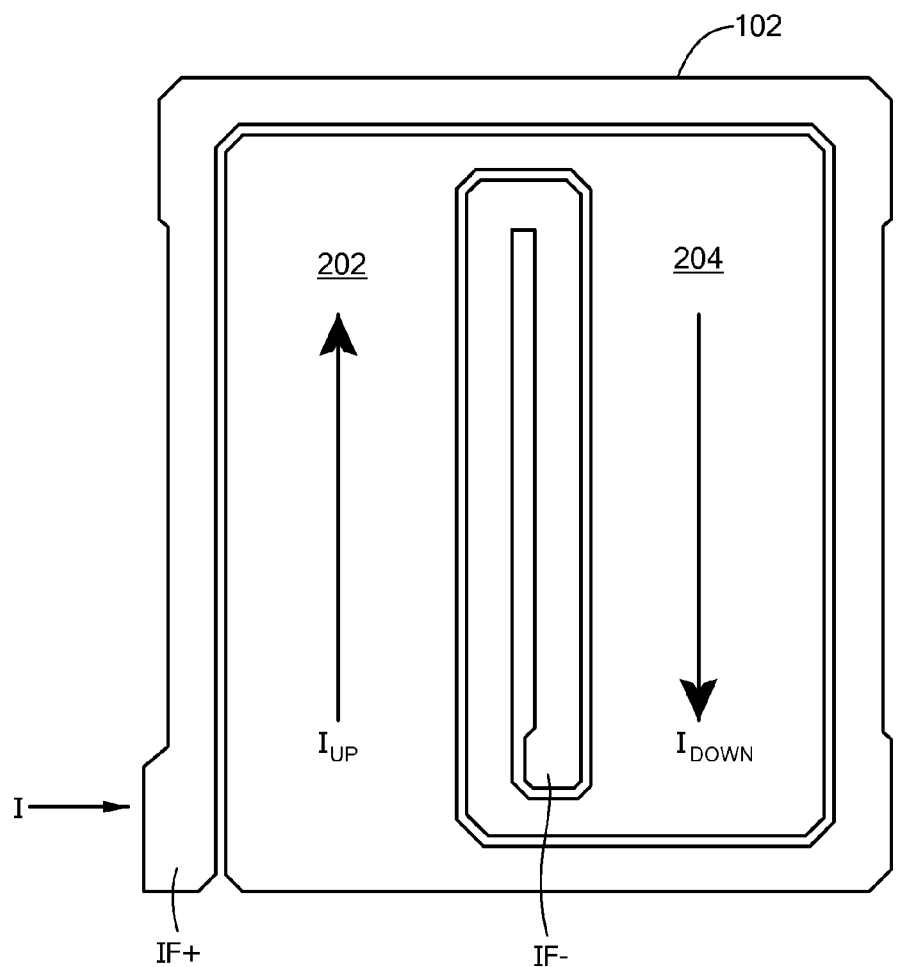
FIG. 4 is a SET coil of the magnetic field sensor of FIG. 2 in accordance with one embodiment of the present invention.

Referring to FIG. 4, the SET coil 102 has first and second coil portions 202, 204. By convention in this specification, a current I introduced at the IF+ lead would produce a current flowing in the direction $I_{up}$ in the first coil portion 202 and a current flowing in the direction $I_{down}$ in the second coil portion 204. Consequently, the current I flowing through the SET coil 102 will present a predetermined magnetization vector in the barber pole structures position adjacent thereto.

Advantageously, embodiments of the present invention provide for a compact and well balanced sensor due to the layout of the barber pole structures as shown in FIG. 2. Referring to the barber pole structures in a first leg portion 110 of the device 100, it is noted that all of the negative polarity structures are in series with one another while undulating across the first coil portion 202 of the SET coil 102. The permalloy with shorting bar combinations, i.e., the barber pole structures, are connected in series by operation of conductive leads 116 deposited on the silicon layer 104. In addition, the barber pole structures with positive polarity are also in series with one another while undulating across the first coil portion 202 of the SET coil 102. This is also true for the barber pole structures located in a second leg portion 112 of the sensor 100 with respect to the second coil portion 204 of the SET coil 102.

Accordingly, series-connected barber pole structures with the positive polarity located in the first leg section 110 are equivalent to the single resistor R1 as shown in the representation of FIG. 1. Those series-connected barber pole structures with the negative polarity also located in the first leg section 110, combine to function as the second resistor R2. On the second leg section 112, the series-connected negative polarity barber pole structures combine to function or operate as the single resistor R4, while the series-connected positive polarity barber pole structures located in the second leg section 112, combine to function or operate as the single resistor R3.

Advantageously, in one embodiment of the present invention, a "nesting" 120 of the conductors 116 connecting the barber pole structures provides for a resistive balance within the Wheatstone bridge such that the two legs are evenly matched with each other. Further, additional lead length 114 is provided in the conductors 116 in order to adjust and balance the total resistance seen in both legs of the Wheatstone bridge.

In operation, embodiments of the present invention provide lower power consumption than those magnetometers that use a SET/RESET functionality. As known, the SET/RESET feature flips the magnetic domains of the barber pole structures in opposite directions. As a result of this flipping, the measurement signal changes polarity as well. The sensor offsets due to resistor manufacturing tolerances remain the same value, however, but by subtracting the two readings, the offset error can be eliminated from the output signal.

It is known, however, that the operation of the SET/RESET feature requires a significant current to pass through conductors in the vicinity of the AMR sensors. This is a disadvantage in mobile applications where low power consumption is important in order to maximize battery life and, therefore, operating time.

In one embodiment of the present invention, the RESET function is eliminated and the SET function frequency is reduced by orders of magnitude. Instead of applying SET and RESET currents for every measurement, only a SET current is passed through the SET coil 102 in order to orient a respective magnetic axis of the barber pole structures. This action will align the magnetic domain orientations of these barber pole structures into one consistent direction. Thus, for a considerably longer period of time, as compared to known systems, no current need pass through the SET coil 102 thus conserving power.

In accordance with one embodiment of the present invention, it is not until the AMR magnetic domain is disturbed by an external interference that the SET action is applied again. In normal operation, it is expected that such a disturbance will not happen for a relatively long period of time ranging from a few minutes to a few days. In consideration of the fact that the method of using SET and RESET currents, and the corresponding power requirements, for every measurement and with measurement frequencies on the order of 50 times per second, the method in accordance with the present embodiment reduces current consumption by many orders of magnitude.

It is noted, however, that using only a SET function may be susceptible to the degrading effects of sensor offset and offset drift due to temperature. In one embodiment of the present invention, a software-based automatic calibration system is used.

The automatic calibration system looks at the sensor output as it changes in response to a change in position of the device relevant to the earth's magnetic field. It is noted that in any particular location, the earth's magnetic field can be considered as a uniform location field. Therefore, as the sensor rotates through different positions and orientations, it will experience maximum and minimum readings. A difference between those two readings will represent twice the magnitude of the earth's magnetic field and the average will be the sensor offset. If the sensor offset value is larger than some predetermined threshold value then a SET pulse is sent through the SET coil.

Figure 5:
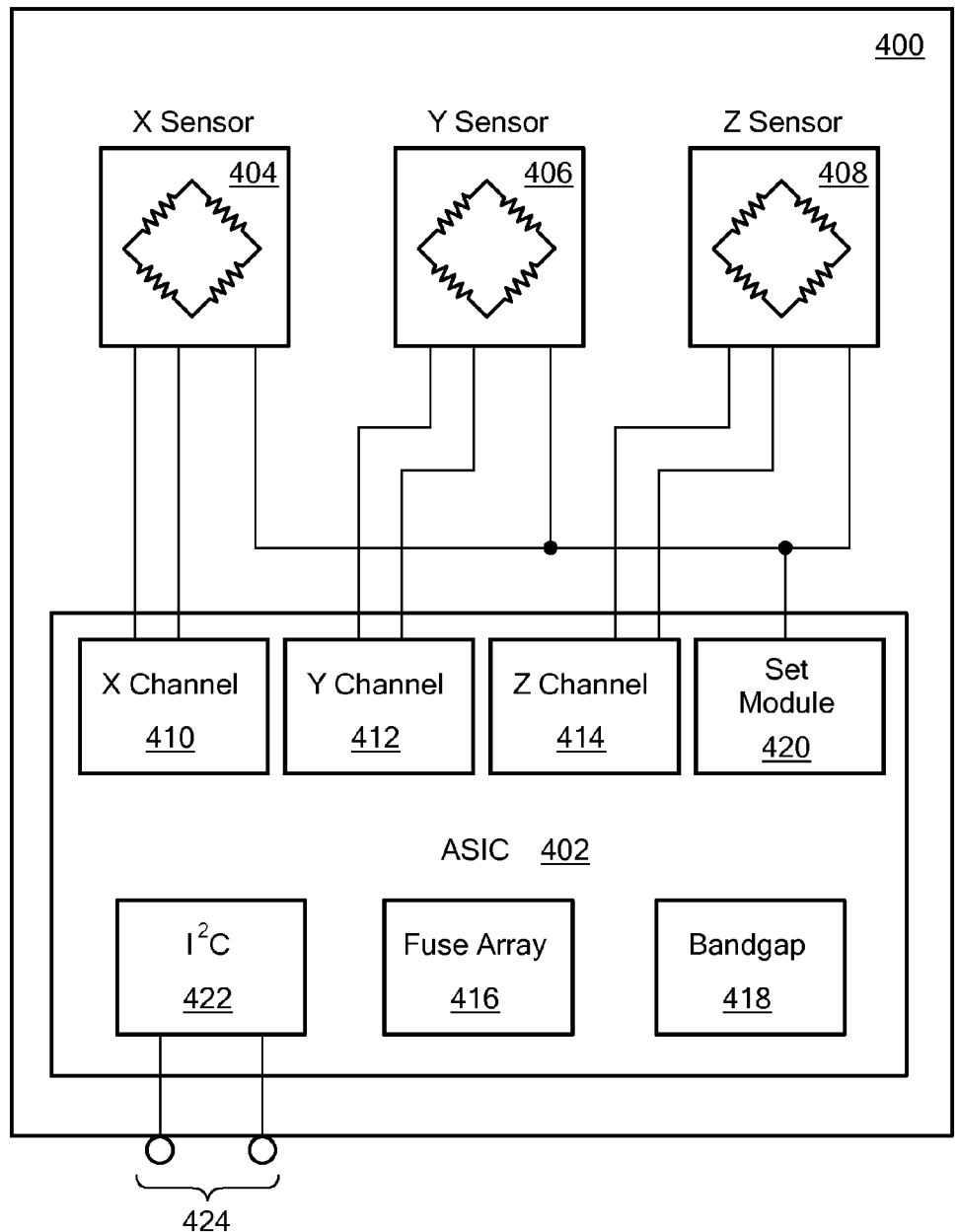
FIG. 5 is a functional block diagram of a tri-axis magnetometer in accordance with one embodiment of the present invention.

In one embodiment of the present invention, referring to FIG. 5, a mixed-signal ASIC 402 interfaces with three separate sensors 404, 406 and 408, i.e., one for each of the X, Y and Z axes, to provide a complete magnetic field measurement system. In one embodiment, the ASIC 402 is designed with 0.6 micrometer (μm) CMOS processes with three metal layers and two polysilicon layers. The chip area is approximately 2.5 mm by 1.7 mm. The differential voltage signals OUT+ and OUT− from each of the AMR Wheatstone bridges in the sensors 404, 406, 408 are fed respectively into three identical signal processing channels 410, 412, 414 that provide low noise amplification, offset adjustment, sensitivity adjustment, temperature compensation and analog to digital conversion.

Each device 400 is individually adjusted and tested for parameters such as sensitivity, offset, biasing voltage, oscillator frequency, etc. Calibration information is stored inside a fuse array 416 during a factory trimming process. A band gap/biasing circuit 418 sets the internal reference voltage as well as the biasing currents for analog circuits and sensor bridges. On-chip driver transistors in a SET module portion 420 provide nominal 450 milliAmps (mA) current for up to 2.5 microseconds for the SET coil. The energy required during the SET event is stored in an external ten microFarad (μF) low ESR capacitor (not shown) that is continuously charged from the power supply. An I²C digital communications module 422 is operated in FAST mode, i.e., up to 400 KHz clock rate, and eliminates the need for an external analog digital converter and provides a two-pin I²C interface 424 to an external MCU.

In one embodiment of the present invention, in normal operation, the ASIC 400 is in a dormant state with virtually no power consumption except for leakage current. When a demand for measurement is initiated by a system MCU, a measurement command is sent through the I²C interface 424. In addition, actions will be triggered by such commands as to execute a SET operation, biasing of the sensor bridge, an analog to digital conversion, etc. The measurement result is then stored in on-chip registers provided in the I²C module 422 waiting to then be transferred to a system MCU. As above, the "on-demand" operation reduces power consumption drastically.

In another embodiment of the present invention, the integrated tri-axis magnetometer 400 is provided in a package that includes the ASIC 402 and the three sensors 404, 406, 408. Advantageously, the package maintains accurate orthogonal angles between the X, Y and Z axes of the sensors 404-408.

Figure 6:
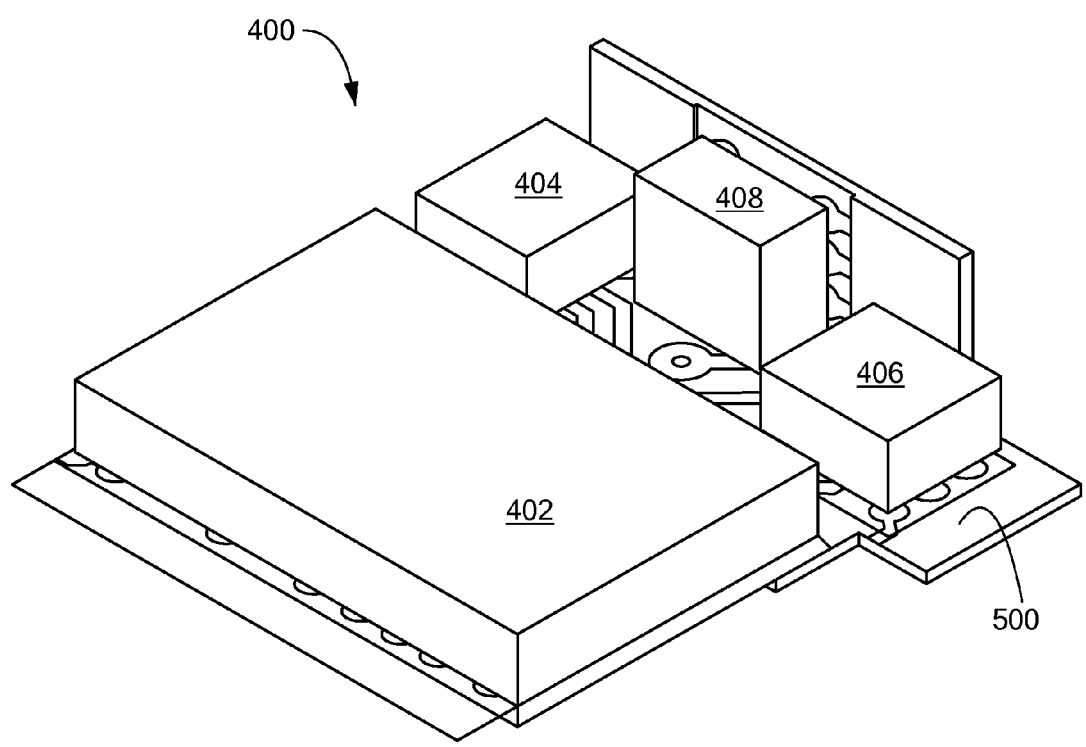
FIG. 6 is a three-dimensional representation of the tri-axis magnetometer of FIG. 5.

As shown in FIG. 6, a 3-D model of a tri-axis sensor 400 with molding or potting material removed to reveal inner structures is presented. The three sensors 404-408 and an ASIC 402 are flip-chip bonded on a flexible substrate 500.

Figure 7:
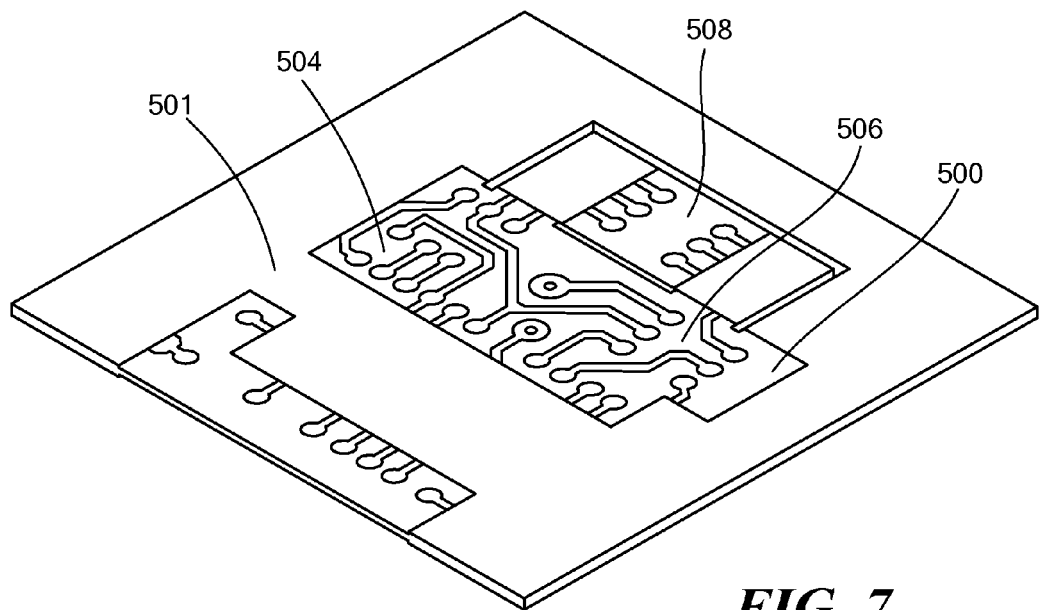
FIG. 7 is a flexible substrate portion of the tri-axis magnetometer.

The tri-axis sensor package 400 begins with the flexible substrate 500, referring now to FIG. 7, provided with conductive interconnect traces and a main section 501 with an ASIC location 502 to receive the ASIC 402, an X-axis sensor location 504 to receive the X-axis sensor 404, a Y-axis sensor location 506 to receive the Y-sensor 406 and a Z-axis location 508 to receive the Z-axis sensor 408. As known to those of ordinary skill in the art, each of the sensors 404-408, as well as the ASIC 402, may be flip-chip bonded to the flexible substrate 500. Of course, one of ordinary skill in the art will understand that there are other mechanisms by which these devices could be attached to the substrate.

Figure 8:
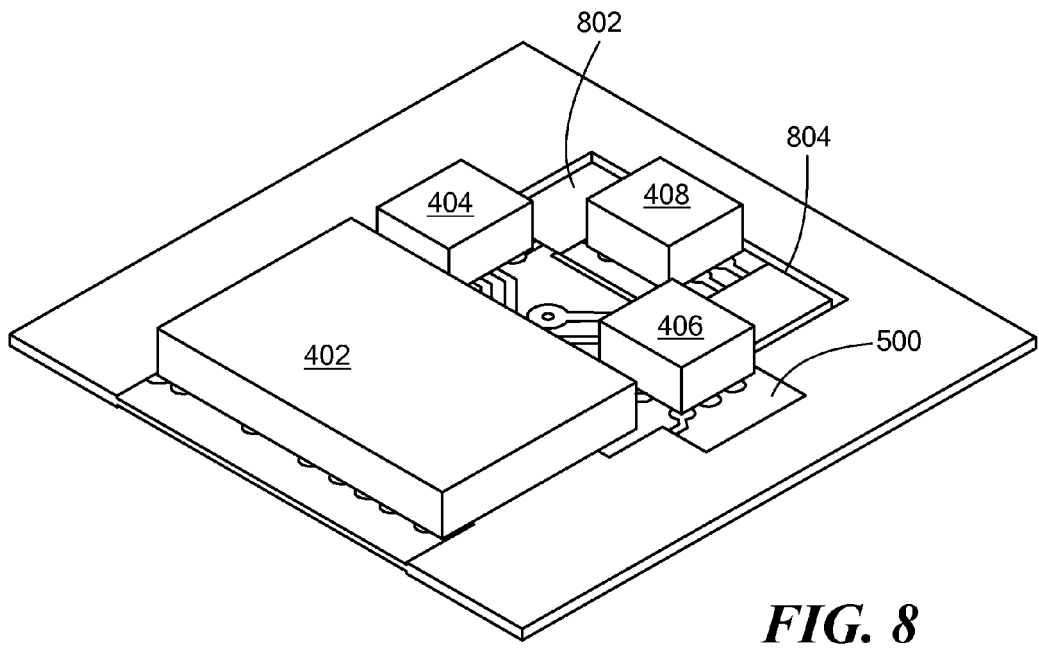
FIG. 8 is a representation of the flexible substrate of FIG. 7 populated with an ASIC and magnetic field sensors.

Referring now to FIG. 8, once the ASIC 400 and the sensors 404-408 are bonded to the substrate 500, subsequent processing is necessary in order to orient the sensors 404-408 along the appropriate axes with respect to one another. As part of the process for manufacturing the sensor 400, a tab portion 802 is defined by excising or cutting along a line or boundary 804 adjacent to the Z-axis sensor 408. One of ordinary skill in the art will understand that there are many different methods of cutting including, but not limited to, air knife, water knife, laser cutter, knife blade, etc.

Figure 9:
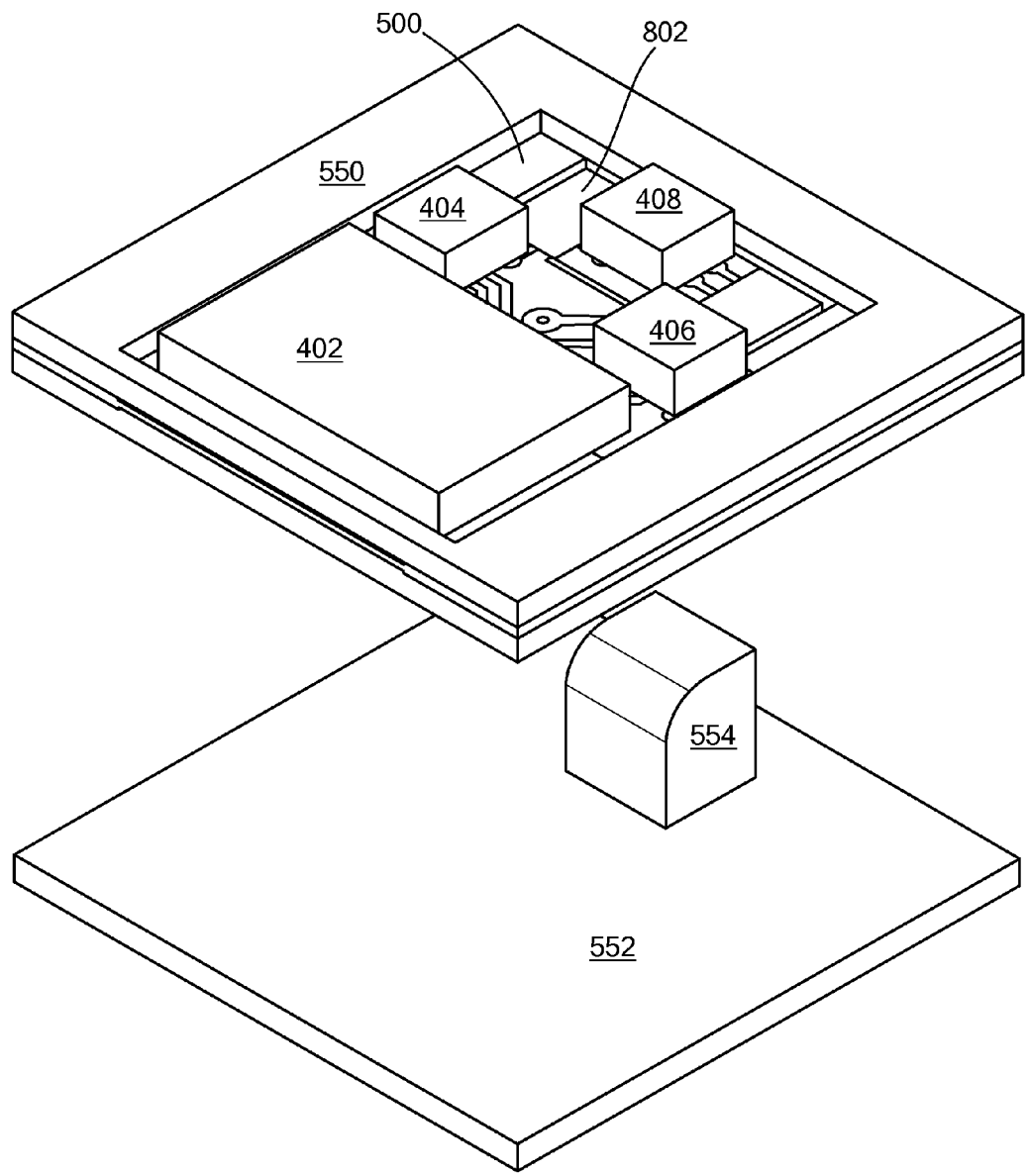
FIGS. 9-11 are representations of the populated flexible substrate of FIG. 8 during its manufacturing process.

Once the line or boundary 804 is cut such that that the tab portion 802 of the flexible substrate 500 is hingeably separated from the remaining material, the flexible substrate 500 is placed in a carrier 550 as shown in FIG. 9. The carrier 550, with the flexible substrate 500 loaded therein, is located above a positioning fixture 552 having an orienting punch 554 located below the Z-axis sensor 408.

Figure 10:
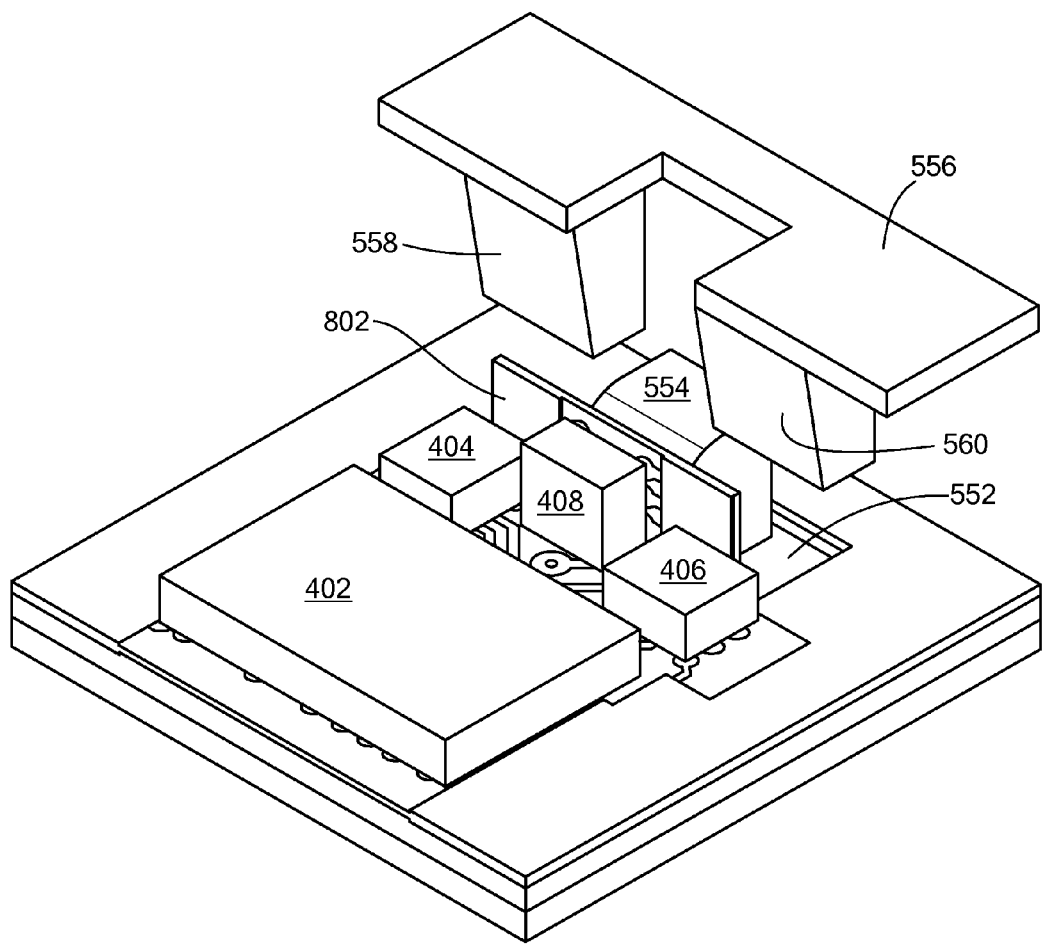

The carrier 550 is lowered down toward the fixture 552 or, alternatively, the fixture 552 is brought up, such that the punch 554 displaces that portion 802 of the flexible circuit 500 to be oriented substantially at 90° with respect to the surface of the flexible substrate 500 and, therefore, also with respect to the other sensors 404, 406, as shown in FIG. 10.

A two-pronged positioning jig 556 having first and second bumpers 558, 560 may be oriented about the punch 554 in order to maintain the tab portion 802 in the appropriate orientation while a subsequent potting operation is performed. Potting material is applied over the devices in order to maintain their respective orientations and for subsequent insertion into the final package.

Figure 11:
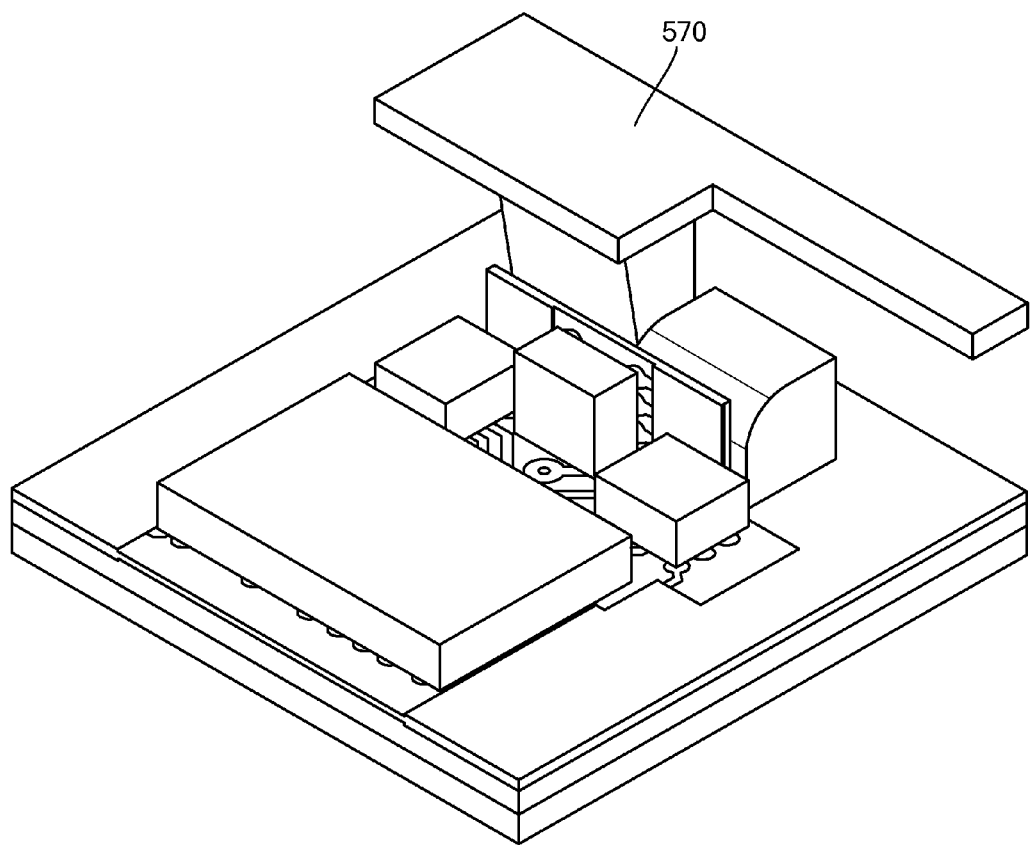

Alternately, as shown in FIG. 11, a single-pronged positioning jig 570 may be used in place of the two-pronged positioning jig 556.

In one embodiment of the present invention, the finished device is a low profile LGA package of 5 mm by 5 mm by 1.2 mm.

Alternatively, the flexible substrate 500 may be configured with two locations on the tab portion 802 provided to receive two sensors, e.g., the sensors 404, 406, with the other sensor 408 to be received on the main portion 501. Thus, when the tab portion 802 is oriented at a right angle to the main portion 501, the orthogonal relationship among the three sensors 404, 406, 408 is maintained.

Figure 12:
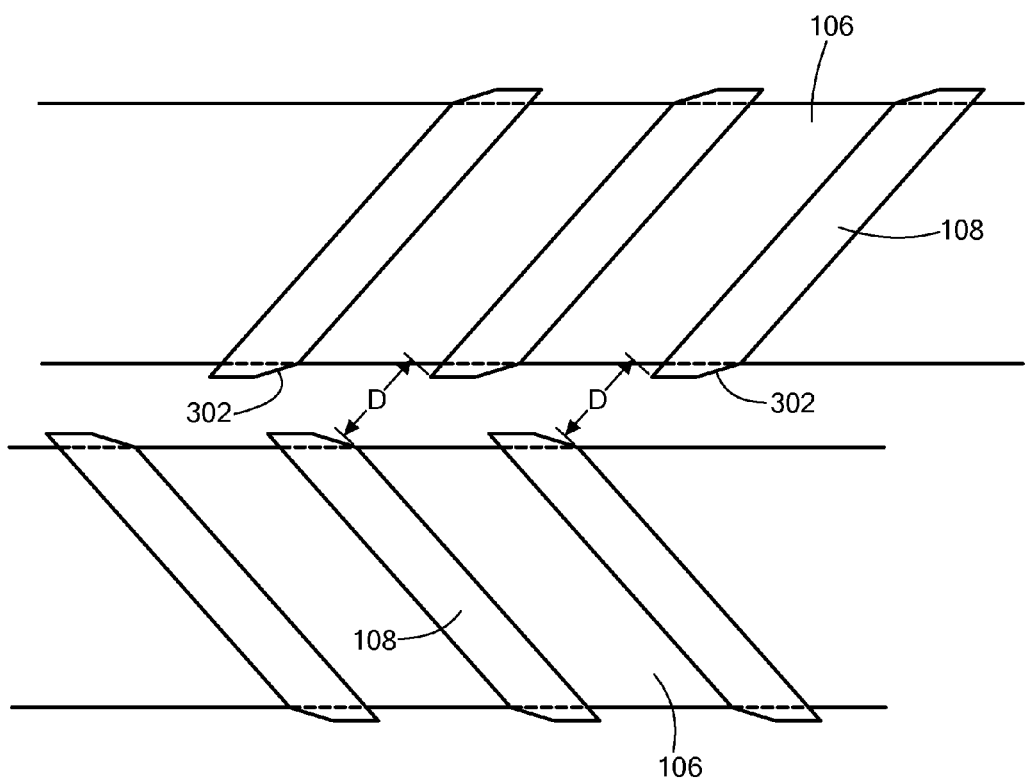
FIG. 12 is a close-up representation of the geometry of the "barber pole" structure in accordance with an embodiment of the present invention.

In yet another embodiment of the present invention, the shorting strips that make up the barber pole structures are designed to allow their placement as close to one another as possible without risking a short circuit that would affect proper operation. Referring now to FIG. 12, a close-up of a portion of a barber pole structure in accordance with one embodiment of the present invention is shown. The permalloy lead 106 and the shorting bars 108 are deposited by a known lithography process. One of ordinary skill in the art will understand that there are other mechanisms or processes by which these barber pole structures can be deposited. In accordance with one embodiment of the present invention, a corner of each shorting bar 108 is cut at an angle to present an offset portion 302 on each shorting bar 108 in order to maximize the distance between the shorting bars 108. Advantageously, by clipping the corners of the shorting bars 108, additional space D between adjacent shorting bars 108 is provided and, therefore, they can be placed closer to one another. In one embodiment, the space D between shorting bars 108 is on the order of 1.5-1.75 µm.

Having thus described several features of at least one embodiment of the present invention, it is to be appreciated that various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of operating an electronic magnetic field measuring device comprising a plurality of anisotropic magnetoresistive (AMR) sensors, the method comprising:
realigning a respective magnetic domain orientation of each AMR sensor in only one direction;
subsequent to the realigning of the respective magnetic domain orientation of each AMR sensor, detecting an output signal from the plurality of AMR sensors, the output signal being representative of a local magnetic field; and
implementing a next realignment step a predetermined amount of time after the prior realignment step.

2. A method of operating an electronic magnetic field measuring device comprising a plurality of anisotropic magnetoresistive (AMR) sensors, the method comprising:
realigning a respective magnetic domain orientation of each AMR sensor in only one direction;
subsequent to the realigning of the respective magnetic domain orientation of each AMR sensor, detecting an output signal from the plurality of AMR sensors, the output signal being representative of a local magnetic field;
detecting a maximum value Vmax for the output signal since last realigning the magnetic domain orientations;
detecting a minimum value Vmin for the output signal since last realigning the magnetic domain orientations; and
comparing (Vmax+Vmin)/2 to a predetermined value PV to determine whether or not the realigning step should be repeated.

3. The method of claim 2, wherein comparing further comprises:
implementing a next realignment step if (Vmax+Vmin)/2 is greater than the predetermined value PV.

4. The method of claim 1, wherein the realigning step comprises:
passing a first current in a first direction through a first conductor positioned near the plurality of AMR sensors, wherein a first magnitude and a first duration of the first current are chosen to sufficiently realign the magnetic domain orientation of each AMR sensor.

5. The method of claim 4, further comprising:
orienting the first direction of the first current to pass each AMR sensor substantially perpendicular relative to a longitudinal direction of each respective AMR sensor.

6. The method of claim 2, wherein the realigning step comprises:
passing a first current in a first direction through a first conductor positioned near the plurality of AMR sensors, wherein a first magnitude and a first duration of the first current are chosen to sufficiently realign the magnetic domain orientation of each AMR sensor.

7. The method of claim 6, further comprising:
orienting the first direction of the first current to pass each AMR sensor substantially perpendicular relative to a longitudinal direction of each respective AMR sensor.

* * * * *